United States Patent
Xie

(10) Patent No.: US 8,410,810 B2
(45) Date of Patent: Apr. 2, 2013

(54) SYSTEM FOR TESTING POWER SUPPLY PERFORMANCE

(75) Inventor: Ling-Yu Xie, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 436 days.

(21) Appl. No.: 12/756,879

(22) Filed: Apr. 8, 2010

(65) Prior Publication Data

US 2011/0156743 A1    Jun. 30, 2011

(30) Foreign Application Priority Data

Dec. 25, 2009   (CN) .......................... 2009 1 0312227

(51) Int. Cl.
  *G01R 31/40*         (2006.01)
(52) U.S. Cl. .................. 324/764.01; 324/73.1; 324/432; 324/512; 320/134; 320/136; 323/246; 323/351
(58) Field of Classification Search ............ 324/764.01, 324/73.1, 432, 512; 320/134, 136; 323/246, 323/351
See application file for complete search history.

(56) References Cited

U.S. PATENT DOCUMENTS

| | | | | |
|---|---|---|---|---|
| 4,611,154 A * | 9/1986 | Lambropoulos et al. | ...... | 318/490 |
| 4,673,862 A * | 6/1987 | Wahlstrom | ..................... | 320/160 |
| 5,600,566 A * | 2/1997 | Park | ................................ | 702/63 |
| 6,424,158 B2 * | 7/2002 | Klang | .............................. | 324/433 |
| 7,772,852 B2 * | 8/2010 | Fechalos et al. | .............. | 324/430 |
| 2010/0007370 A1* | 1/2010 | Dishman et al. | .............. | 324/771 |
| 2011/0018580 A1* | 1/2011 | Tamagawa et al. | ...... | 324/764.01 |

* cited by examiner

*Primary Examiner* — Huy Q Phan
*Assistant Examiner* — Thang Le
(74) *Attorney, Agent, or Firm* — Altis Law Group, Inc.

(57) ABSTRACT

A system for testing a DC power supply performance includes a load module electrically coupled to the DC power supply, a switch module electrically coupled to the DC power supply, a control module electrically coupled to the load module and the switch module respectively, and an indication module electrically coupled to the control module. The control module includes a judge module and a comparison module. The judge module is configured for receiving DC voltage signals from the DC power supply; wherein the judge module is capable of turning on when the DC power supply is normal. The comparison module is configured for comparing the DC voltage signals with a reference voltage; wherein the comparison module is capable of outputting a control signal when the DC voltage signals are greater than the reference voltage. The indication module is configured for receiving the control signal and indicating status of the DC power supply.

9 Claims, 2 Drawing Sheets

SYSTEM FOR TESTING POWER SUPPLY PERFORMANCE

BACKGROUND

1. Technical Field

The present disclosure relates to testing systems, and particularly to a system for testing power supply performance.

2. Description of Related Art

Most electronic apparatuses are not equipped with internal power supply devices in order to save space and costs. Therefore, these electronic apparatuses require external power supplies. Computers are powered by power supplies, which are capable of converting alternating current into direct current. The reliability of power supplies is measured by comparing the input and output voltages of the power supplies. Testing power supplies under voltage is an important test for determining reliability. By measuring the output voltages of the power supply to see if they are within allowable limits. However, the above testing method needs a special test apparatus to test the power supply, which increases the testing cost.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

In general, the word "module," as used herein, refers to logic embodied in hardware or firmware, or to a collection of software instructions, written in a programming language, such as, for example, Java, C, or Assembly. One or more software instructions in the modules may be embedded in firmware, such as an EPROM. It will be appreciated that modules may comprise connected logic units, such as gates and flip-flops, and may comprise programmable units, such as programmable gate arrays or processors. The modules described herein may be implemented as either software and/or hardware modules and may be stored in any type of computer-readable medium or other computer storage device.

Figure 1:
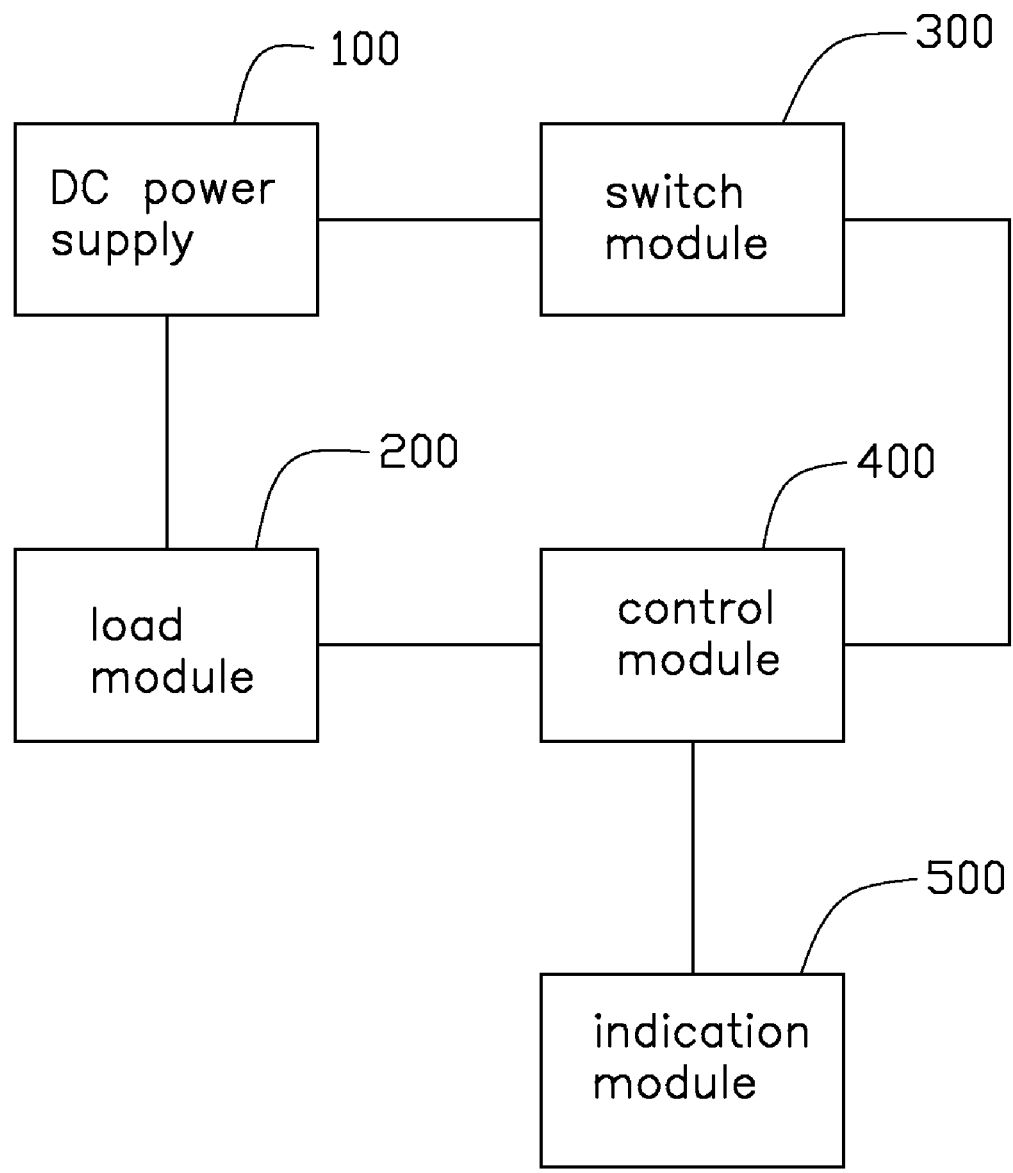
FIG. 1 is a block view of an embodiment of a system for testing power supply performance.

Referring to FIG. 1, a system in an embodiment for testing power supply performance includes a DC power supply 100, a load module 200, a switch module 300, a control module 400, and an indication module 500. The DC power supply 100 includes a plurality of output terminals for outputting +5 Vaux (standby voltage of +5V), +5V, +3.3V, +12V, −12V, PS-ON (Power Supply On) and PG (Power Good) voltage signals.

Figure 2:
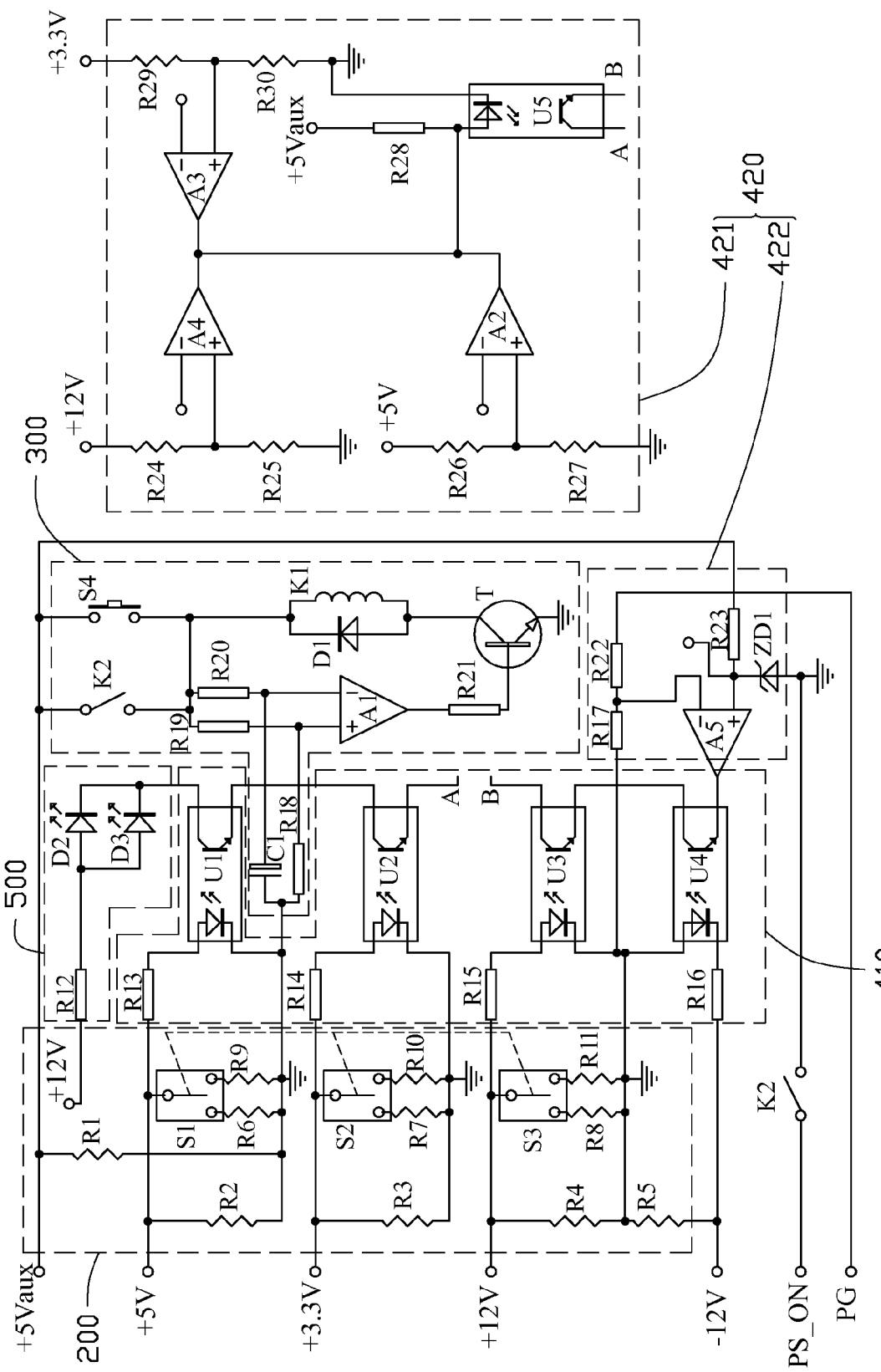
FIG. 2 is a circuit view of the system of FIG. 1.

Referring to FIG. 2, the load module 200 includes resistors R1~R11, and linked switches S1~S3. The +5 Vaux, +5V, +3.3V, +12V, and −12V voltage output terminals are grounded via the resistors R1~R5 respectively. The +5V voltage output terminal is electrically coupled to a resistor R6 first terminal and a resistor R9 first terminal via the linked switch S1. A resistor R6 second terminal and a resistor R9 second terminal are grounded. The +3.3V voltage output terminal is electrically coupled to a resistor R7 first terminal and a resistor R10 first terminal via the linked switch S2. A resistor R7 second terminal and a resistor R10 second terminal are grounded. The +12V voltage output terminal is electrically coupled to a resistor R8 first terminal and a resistor R11 first terminal via the linked switch S3. A resistor R8 second terminal and a resistor R11 second terminal are grounded.

The switch module 300 includes a press stopper S4, a relay, a diode D1, a transistor T, an amplifier A1, resistors R18~R21, and a capacitor C1. The relay includes a winding element K1, and a normally open contact K2. A winding element K1 first terminal is electrically coupled to a diode D1 cathode. A connection point between the winding element K1 and the diode D1 cathode is electrically coupled to the +5 Vaux voltage output terminal via the press stopper S4 and the normally open contact K2 respectively. A winding element K1 second terminal is electrically coupled to a diode D1 anode. A connection point between the winding element K1 and the diode D1 anode is electrically coupled to a transistor T collector. A transistor T emitter is grounded. A transistor T base is electrically coupled to an amplifier A1 output terminal via the resistor R21. An amplifier A1 non-inverting input terminal and an amplifier A1 inverting input terminal are grounded via the resistor R18 and capacitor C1 respectively, and are electrically coupled to a connection point between the normally open contact K2 and press stopper S4 via the resistors R19 and R20 respectively.

The control module 400 includes a judge module 410, and a comparison module 420. The judge module 410 includes resistors R13~R16, and photocouplers U1~U4. Each photocoupler includes a light emitting element and a switch element. The light emitting elements are electrically coupled to the +5V, +3.3V, +12V, and −12V voltage output terminals via the resistors R13~R16 as the corresponding photocouplers U1~U4 input terminals. The switch elements are electrically connected in series in the same manner as the corresponding photocouplers U1~U4 output terminals.

The comparison module 420 includes a first comparison circuit 421 and a second comparison circuit 422. The first comparison circuit 421 includes comparators A2~A4, a photocoupler U5, and resistors R24~R30. A comparator A2 non-inverting input terminal, a comparator A3 non-inverting input terminal, and a comparator A4 non-inverting input terminal are electrically coupled to the +5V, +3.3V, and +12V voltage output terminals respectively via the resistors R26, R29 and R24. A comparator A2 non-inverting input terminal, a comparator A3 non-inverting input terminal, and a comparator A4 non-inverting input terminal are grounded via the resistors R27, R30 and R25 respectively. A comparator A2 inverting input terminal, a comparator A3 inverting input terminal, and a comparator A4 inverting input terminal are configured for receiving a reference voltage. The photocoupler U5 light emitting element is electrically coupled to the +5 Vaux voltage output terminal as its input terminal. The photocoupler U5 switch element is electrically coupled between the photocouplers U2 and U3 switch elements as output terminals. The second comparison circuit 422 includes a comparator A5, a Zener diode ZD1, and resistors R17, R22, and R23. A comparator A5 non-inverting input terminal is electrically coupled to the +5 Vaux voltage output terminal via the resistor R23 and a diode ZD1 cathode. A diode ZD1 anode is grounded and is electrically coupled to the PS-ON voltage output terminal via the normally open contact K2. A comparator A5 inverting input terminal is electrically coupled to the PG voltage output terminal via the resistor R22 and is grounded via the resistor R17. A comparator A5 output terminal is electrically coupled to the photocoupler U4 switch element. In one embodiment, the reference voltage is 2.5 volts.

The indication module 500 includes light emitting diodes D2, D3, and a resistor R12. A diode D2 anode is electrically coupled to a diode D3 anode. A connection point between the diodes D2, D3 anodes is electrically coupled to the +12V voltage output terminal via the resistor R12. A diode D2 cathode and a diode D3 cathode are electrically coupled to the photocoupler U1 switch element.

During a test, the DC power supply 100 is electrically coupled to the test system as shown in FIG. 2. The press stopper S4 is pressed once, and then it is released. A voltage level of the amplifier A1 non-inverting input terminal increases to 5 volts rapidly. A voltage level of the amplifier A1 inverting input terminal increases from 0 volt slowly. A voltage level of the amplifier A1 output terminal is high. The transistor T turns on, and the winding element K1 powers up. The normally open contact K2 also turns on. If the +5V, +3.3V, +12V, and −12V voltage output terminals output voltage signals, the photocouplers U1~U4 corresponding light emitting elements emit light, and the corresponding switch elements turns on. The comparator A5 non-inverting input terminal receives a 2.5 volts reference voltage from the +5 Vaux voltage output terminal. The comparators A2~A4 inverting input terminals also receives the 2.5 volts reference voltage respectively. The +5V, +3.3V, +12V, and PG voltage signals are decreased in proportion. The decreased +5V, +3.3V, +12V, and PG voltage signals compare with the 2.5 volts reference voltage. If the +5V, +3.3V, and +12V voltage signals are normal, the photocoupler U5 light emitting element emit light. The corresponding switch element turns on. If the PG voltage signal is also normal, the comparator A5 output terminal outputs a low voltage level. The diodes D2 and D3 anodes receive the +12V voltage signal. The diodes D2 and D3 cathodes are grounded via the judge module 410, and the comparison module 420 in series. The diodes D2, D3 emit light to indicate whether the DC power supply 100 is normal.

It is to be understood, however, that even though numerous characteristics and advantages of the embodiments have been set forth in the foregoing description, together with details of the structure and function of the embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A system for testing a DC power supply performance, comprising:
    a load module electrically coupled to the DC power supply;
    a switch module electrically coupled to the DC power supply; and
    a control module electrically coupled to the load module and the switch module respectively, comprising:
        a judge module capable of receiving DC voltage signals from the DC power supply; wherein the judge module is capable of turning on when the DC power supply is normal;
        a comparison module capable of comparing the DC voltage signals with a reference voltage; wherein the comparison module is capable of outputting a control signal when the DC voltage signals are greater than the reference voltage; and
        an indication module capable of receiving the control signal and indicating status of the DC power supply.

2. The system of claim 1, wherein DC power supply comprises a first voltage output terminal and a second voltage output terminal; the judge module comprises a first photocoupler; the comparison module comprises a second photocoupler; a first photocoupler input terminal is electrically coupled to the second voltage output terminal; a first photocoupler output terminal is grounded via the second photocoupler; a second photocoupler input terminal is electrically coupled to the first voltage output terminal; and the switch module is electrically coupled to the first voltage output terminal.

3. The system of claim 2, wherein the switch module comprises a press stopper, a relay, a switch element, and a delay circuit; the relay comprises a winding element, and a normally open contact; a winding element first terminal is electrically coupled to the first voltage output terminal via the press stopper; and a winding element second terminal is grounded via the switch element.

4. The system of claim 3, wherein a delay circuit first input terminal is electrically coupled to the first voltage output terminal via the normally open contact; a delay circuit second input terminal is electrically coupled to the second voltage output terminal via the first photocoupler input terminal; and a delay circuit output terminal is electrically coupled to the switch element.

5. The system of claim 2, wherein the judge module further comprises a comparator, a first resistor, and a second resistor; a comparator inverting input terminal is configured for receiving the reference voltage; a comparator non-inverting input terminal is electrically coupled to the second voltage output terminal via the first resistor, and is grounded via the second resistor; and a comparator output terminal is electrically coupled to the first voltage output terminal.

6. The system of claim 4, wherein the delay circuit comprises a first amplifier, a third resistor, a fourth resistor, a fifth resistor, and a capacitor; a first amplifier non-inverting and a first amplifier inverting input terminal are electrically coupled to a third resistor first terminal and a fourth resistor first terminal respectively, and are electrically coupled to a fifth resistor first terminal and a capacitor first terminal respectively; a third resistor second terminal and a fourth resistor second terminal are electrically connected as the delay circuit first input terminal; a fifth resistor second terminal and a capacitor second terminal are electrically connected as the delay circuit second input terminal; a first amplifier output terminal acts as the delay circuit output terminal.

7. The system of claim 6, wherein the switch element is a NPN type transistor; a transistor base is electrically coupled to the first amplifier output terminal; a transistor collector is electrically coupled to the press stopper via the winding element; a transistor emitter is grounded.

8. The system of claim 6, wherein the DC power supply further comprises a third voltage output terminal, and a fourth voltage output terminal; the comparison module further comprises a second amplifier, a sixth resistor, and a Zener diode; a second amplifier non-inverting input terminal is electrically coupled to the first voltage output terminal via the sixth resistor, and is electrically coupled to a Zener diode cathode; a Zener diode anode is grounded, and is electrically coupled to the third voltage output terminal via the normally open contact; a second amplifier inverting input terminal is electrically coupled to the fourth voltage output terminal; a second amplifier output terminal is electrically coupled to the first photocoupler output terminal.

9. The system of claim 8, wherein the indication module comprises a light emitting device or a sound device electrically coupled to the first photocoupler output terminal.

* * * * *